(12) United States Patent
Plettner et al.

(10) Patent No.: US 9,793,089 B2
(45) Date of Patent: Oct. 17, 2017

(54) ELECTRON EMITTER DEVICE WITH INTEGRATED MULTI-POLE ELECTRODE STRUCTURE

(71) Applicant: KLA-Tencor Corporation, Milpitas, CA (US)

(72) Inventors: Thomas Plettner, San Ramon, CA (US); Mehran Nasser-Ghodsi, Hamilton, MA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 272 days.

(21) Appl. No.: 14/485,588

(22) Filed: Sep. 12, 2014

(65) Prior Publication Data

US 2015/0076988 A1    Mar. 19, 2015

Related U.S. Application Data

(60) Provisional application No. 61/878,545, filed on Sep. 16, 2013.

(51) Int. Cl.
*H01J 1/304* (2006.01)
*H01J 37/153* (2006.01)
(Continued)

(52) U.S. Cl.
CPC .......... *H01J 37/153* (2013.01); *H01J 37/073* (2013.01); *H01J 37/1471* (2013.01); *H01J 37/28* (2013.01);
(Continued)

(58) Field of Classification Search
CPC ........ H01J 37/28; H01J 37/285; H01J 37/153; H01J 1/30–1/3044; H01J 2329/4604–2329/4639; H01J 1/46
See application file for complete search history.

(56) References Cited

U.S. PATENT DOCUMENTS

| | | | |
|---|---|---|---|
| 5,363,021 A | 11/1994 | MacDonald | |
| 5,633,190 A | 5/1997 | Sugiyama | |

(Continued)

FOREIGN PATENT DOCUMENTS

| | | |
|---|---|---|
| JP | 09134695 A | 5/1997 |
| JP | H09134664 | 5/1997 |
| WO | 0024030 | 4/2000 |

OTHER PUBLICATIONS

Non-Final Office Action for U.S. Appl. No. 14/485,574, dated Jun. 16, 2015.

(Continued)

*Primary Examiner* — Mariceli Santiago
(74) *Attorney, Agent, or Firm* — JDI Patent; Joshua D. Isenberg

(57) ABSTRACT

A field emission device comprises one or more emitter elements, each having a high aspect ratio structure with a nanometer scaled cross section; and one or more segmented electrodes, each surrounding one of the one or more emitters. Each of the one or more segmented electrodes has multiple electrode plates. This abstract is provided to comply with rules requiring an abstract that will allow a searcher or other reader to quickly ascertain the subject matter of the technical disclosure. It is submitted with the understanding that it will not be used to interpret or limit the scope or meaning of the claims.

24 Claims, 5 Drawing Sheets

(51) Int. Cl.
*H01J 37/073* (2006.01)
*H01J 37/28* (2006.01)
*H01J 37/285* (2006.01)
*H01J 37/147* (2006.01)
*B82Y 15/00* (2011.01)
*B82Y 40/00* (2011.01)
*H01J 9/02* (2006.01)

(52) U.S. Cl.
CPC ............ *H01J 37/285* (2013.01); *B82Y 15/00* (2013.01); *B82Y 40/00* (2013.01); *H01J 9/025* (2013.01); *H01J 2203/0216* (2013.01); *H01J 2237/06375* (2013.01); *H01J 2237/28* (2013.01); *H01J 2237/31774* (2013.01); *Y10S 977/842* (2013.01); *Y10S 977/939* (2013.01)

(56) References Cited

U.S. PATENT DOCUMENTS

| | | | |
|---|---|---|---|
| 5,892,231 A * | 4/1999 | Baylor | H01J 37/3175 250/398 |
| 6,498,349 B1 * | 12/2002 | Thomas | H01J 37/3175 250/397 |
| 6,720,569 B1 | 4/2004 | Johnson et al. | |
| 6,871,439 B1 | 3/2005 | Edwards | |
| 6,979,947 B2 * | 12/2005 | Yaniv | B82Y 10/00 313/309 |
| 8,513,619 B1 | 8/2013 | Nasser-Ghodsi et al. | |
| 8,618,513 B2 | 12/2013 | Plettner et al. | |
| 2001/0040215 A1 | 11/2001 | Ahmed et al. | |
| 2004/0032194 A1 | 2/2004 | Koga et al. | |
| 2005/0023568 A1 | 2/2005 | Nishimura | |
| 2005/0056881 A1 | 3/2005 | Yeo et al. | |
| 2005/0105690 A1 | 5/2005 | Pau et al. | |
| 2005/0116600 A1 | 6/2005 | Chi et al. | |
| 2006/0017363 A1 * | 1/2006 | Wei | B82Y 10/00 313/311 |
| 2007/0235772 A1 * | 10/2007 | Jin | G09G 3/22 257/236 |
| 2009/0072409 A1 | 3/2009 | Nitta et al. | |
| 2009/0166557 A1 * | 7/2009 | Makino | H01J 37/026 250/442.11 |
| 2010/0009273 A1 | 1/2010 | Kim | |
| 2010/0009474 A1 | 1/2010 | Kim et al. | |
| 2010/0090579 A1 * | 4/2010 | Sellmair | H01J 37/063 313/160 |
| 2011/0073917 A1 | 3/2011 | Zhong et al. | |
| 2011/0189394 A1 | 8/2011 | Noda et al. | |
| 2012/0032273 A1 | 2/2012 | Suzuki | |
| 2012/0168878 A1 | 7/2012 | Abou-Khalil et al. | |
| 2013/0228866 A1 | 9/2013 | Lee et al. | |
| 2014/0218503 A1 | 8/2014 | Gerling et al. | |
| 2014/0239805 A1 | 8/2014 | Plettner | |

OTHER PUBLICATIONS

Final Office Action for U.S. Appl. No. 14/485,574, dated Oct. 1, 2015.
Co-Pending U.S. Appl. No. 14/476,537, to John Gerling, filed Sep. 3, 2014.
Co-Pending U.S. Appl. No. 14/486,739, to Tomas Plettner, filed Sep. 15, 2014.
Co-Pending U.S. Appl. No. 14/485,574, to Tomas Plettner, filed Sep. 12, 2014.
U.S. Appl. No. 61/874,834, to John Gerling, filed Sep. 6, 2013.
U.S. Appl. No. 61/878,545, to Tomas Plettner, filed Sep. 16, 2013.
U.S. Appl. No. 61/878,606, to Tomas Plettner, filed Sep. 17, 2013.
U.S. Appl. No. 61/878,609, to Tomas Plettner, filed Sep. 17, 2013.
International Search Report and Written Opinion for International Application No. PCT/US2014/055868, dated Dec. 9, 2014.
International Search Report and Written Opinion for International Application No. PCT/US2014/055937, dated Jan. 14, 2015.
Non-Final Office Action for U.S. Appl. No. 14/485,574, dated Oct. 18, 2016.
Final Office Action for U.S. Appl. No. 14/485,574, dated Feb. 21, 2017.
Supplementary European Search Report dated Mar. 28, 2017 for Application EP14844702.

* cited by examiner

ELECTRON EMITTER DEVICE WITH INTEGRATED MULTI-POLE ELECTRODE STRUCTURE

CLAIM OF PRIORITY

This application is a nonprovisional of and claims the priority benefit of commonly owned, U.S. Provisional Patent Application No. 61/878,545, to Tomas Plettner et al., filed Sep. 16, 2013, and entitled "INTEGRATED GUN MULTI-POLE EMITTER GATE STRUCTURE" the entire disclosures of which are incorporated herein by reference.

FIELD OF THE INVENTION

Embodiments of the present invention relate to a field emission device and a method for manufacturing the same, and more particularly, to a field emission device with segmented electrode provided close to the emitter for axial correction and deflection and astigmatism correction.

BACKGROUND OF THE INVENTION

Field emission is emission of electrons induced by a high intensity electrostatic field. A conventional field emission device comprises a cathode and an anode spaced from the cathode. The cathode may be a field emitter array including one or more field emitter elements. A voltage applied between the anode and cathode induces the emission of electrons towards the anode. Field emission devices have been utilized as bright electron sources for high-resolution electron microscopes.

In order to create a high intensity electric field (e.g., about $1 \times 10^7$ volts per centimeter) to extract electrons from emitters, tip/needle emitters are developed. For example, carbon nanotubes (CNTs) are a carbon material with a sharp tip that has a minute structure of a nanometer size with a high aspect ratio. CNTs have increasingly being utilized as electron field emitters because of their high electrical conductivity, high aspect ratio "needle like" shape for optimum geometrical field enhancement, and remarkable thermal stability.

A conventional method of fabricating tip/needle emitters, such as CNTs, involves depositing CNTs on a patterned layer of catalyst at preferred locations of the cathode. CNTs are directly grown on the cathode and ideally perpendicular to the cathode substrate surface, and are therefore well aligned with respect to the electric field applied in a gated field emission structure. However, tip/needle emitters do not necessarily grow straight or to the same length. In order to use these needles as emitters in a microscope or other e-beam systems, the electron beam emerging from needle emitters has to be corrected.

Conventional field electron devices may include several electrodes to control/correct the electron beams. Emission current control may be performed by a suppressor electrode near the emitter. In some systems, the current is adjusted by the extractor electrode and two electrostatic lenses provided relatively far from the emitter while maintaining a focus at the image plane. In addition, blanking is usually performed by deflector elements located downstream of the emitter region. Stigmation and beam steering are also performed downstream of the emitter region. Since these electrodes for optical aberration corrections are provided far from the emitter (e.g., 1 mm), relatively large voltages are required to either steer the beam, perform the blanking operation, or to adjust the beam current. In addition, since the first possible beam steering and stigmation control occurs after the beam condensing, there is no control in the emitter region to center the individual beam to the condensing lens optical center in an emitter array architecture.

It is within this context that aspects of the present disclosure arise.

SUMMARY

According to aspects of the present disclosure, a field emission device comprises one or more emitter elements. Each emitter element is a high aspect ratio structure with a nanometer scale cross section. One or more segmented electrodes correspondingly surround the one or more emitter elements. Each segmented electrodes includes multiple electrode plates.

In some implementations, the one or more segmented electrodes are provided behind tips of corresponding emitters.

In some implementations, the one or more emitter elements include nanotubes.

In some implementations, the one or more segmented electrodes have 4, 8, 12 or 16 electrode plates.

In some implementations, each of the one or more emitters are in a length between about 100 nanometers and about 1 millimeter and a cross-sectional dimension between about 10 nanometers (nm) and about 1 micron (μm)

According to aspects of the present disclosure, a method comprises forming one or more emitter elements on a substrate, wherein each of the one or more emitter elements has a high aspect ratio structure with a nanometer scale cross section; and forming one or more segmented electrodes, each surrounding one of the one or more emitters. Each of the one or more segmented electrodes includes multiple electrode plates.

BRIEF DESCRIPTION OF THE DRAWINGS

Objects and advantages of the invention will become apparent upon reading the following detailed description and upon reference to the accompanying drawings in which.

DETAILED DESCRIPTION

In the following Detailed Description, reference is made to the accompanying drawings, which form a part hereof, and in which is shown by way of illustration specific embodiments in which the invention may be practiced. The drawings show illustrations in accordance with examples of embodiments, which are also referred to herein as "examples". The drawings are described in enough detail to enable those skilled in the art to practice the present subject matter. Because components of embodiments of the present invention can be positioned in a number of different orientations, directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

A field emission device according to present disclosure includes one or more emitter having a high aspect ratio structure with a nanometer scaled cross section and a segmented electrode provided proximately to the tip of the emitter for optical aberration corrections (e.g., axial correction and deflection and astigmatism correction). The segmented electrode in the field emission device according to the present disclosure may have 4, 8, 12 or 16 electrode plates and each is electrically isolated from other plates. The plates are configured such that a separate voltage can be applied independently to each electrode plate. Depending on the voltages applied to the electrode plates, the segmented electrode may function as a gate and a steering element to provide high-speed blanking to block emission, high-bandwidth servo control of the beam and high bandwidth stigmation and beam steering control. As used herein the term stigmation control generally refers to control of the roundness of the beam due to different focusing properties in orthogonal directions transverse to the beam axis. The segmented electrode according to the present disclosure may be manufactured independently of the emission device or manufactured as an integrated part of the emission device through techniques such as nanofabrication/MEMS.

Figure 1A:
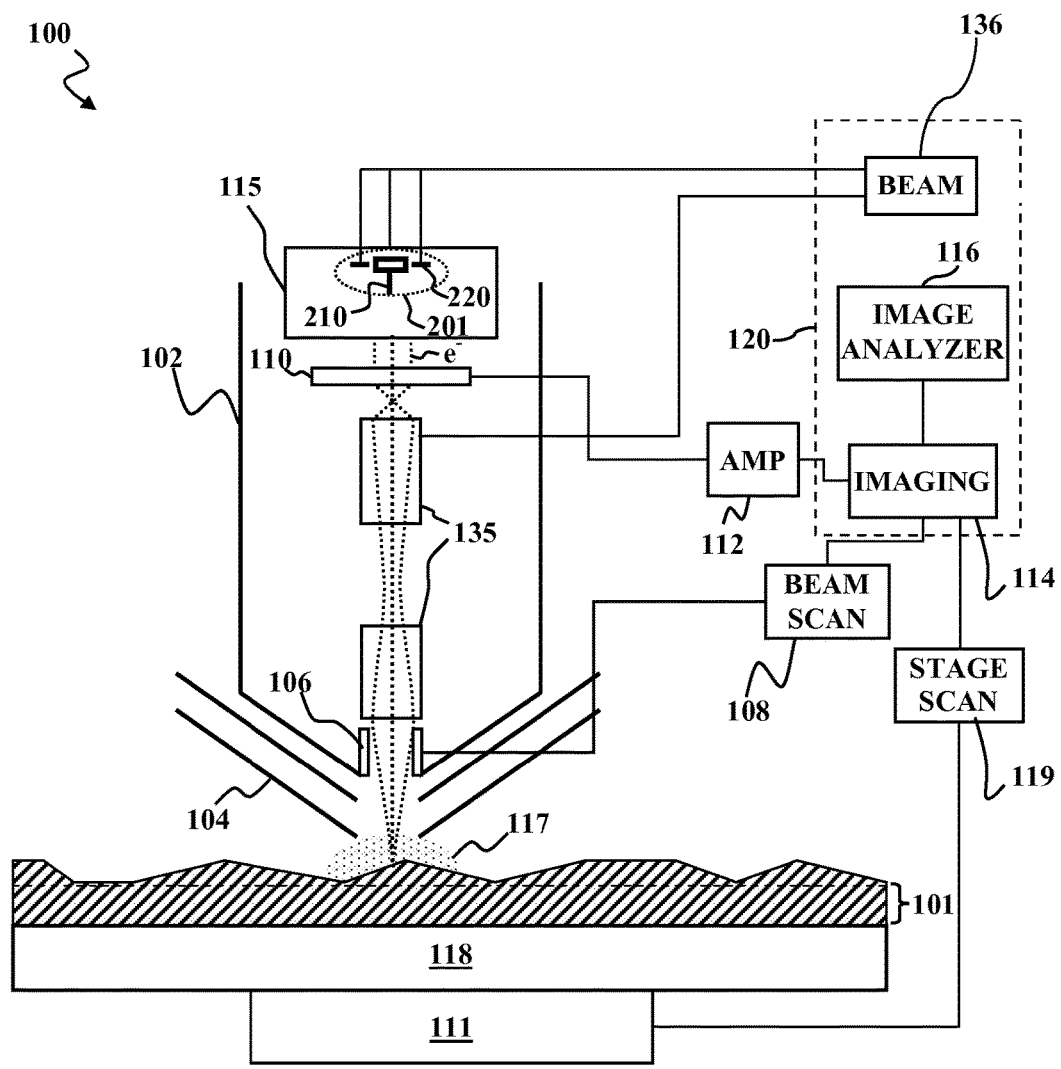
FIG. 1A is a schematic diagram of a charged particle beam system adapted to include a field emitter device according to an aspect of the present disclosure.
Figure 1B:
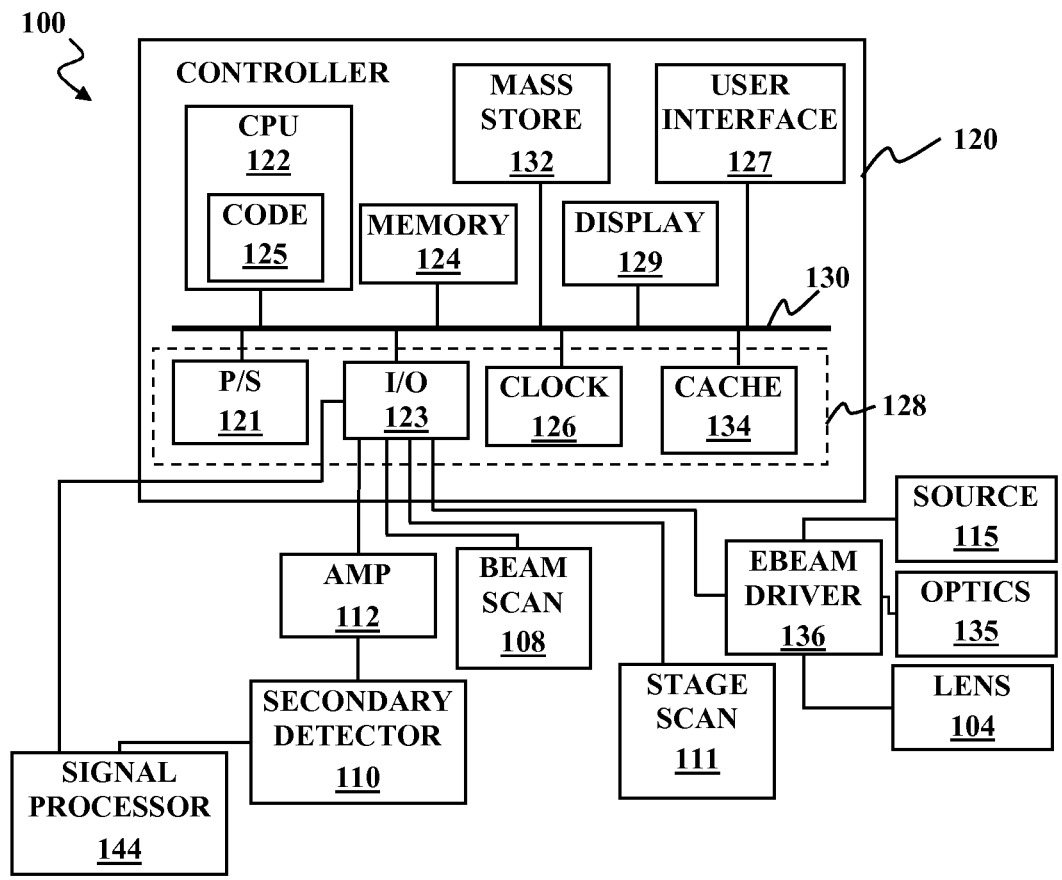
FIG. 1B is a block diagram of the system of FIG. 1A

FIG. 1A and FIG. 1B illustrate an example of a charged particle beam system 100 that incorporates certain aspects of the present disclosure. In this non-limiting example, the system 100 is configured as a scanning electron microscope (SEM) having charged particle optical column 102 with an electron source 115, beam optics elements 135, an immersion lens 104. The optical column 102 may be controlled by electronics 136, referred to herein as a beam driver. The beam driver 136 may control the electron source 115, beam optics elements 135 and immersion lens 104. In this example, the beam optics 135 include two or more electrically conductive cylinders maintained at voltages that produce electric fields to extract electrons from the source 115 and form them into a primary beam 103 that travels in the direction of a target 101. The immersion lens 104 focuses the primary beam into a narrow spot at the surface of the target.

Figure 4A:
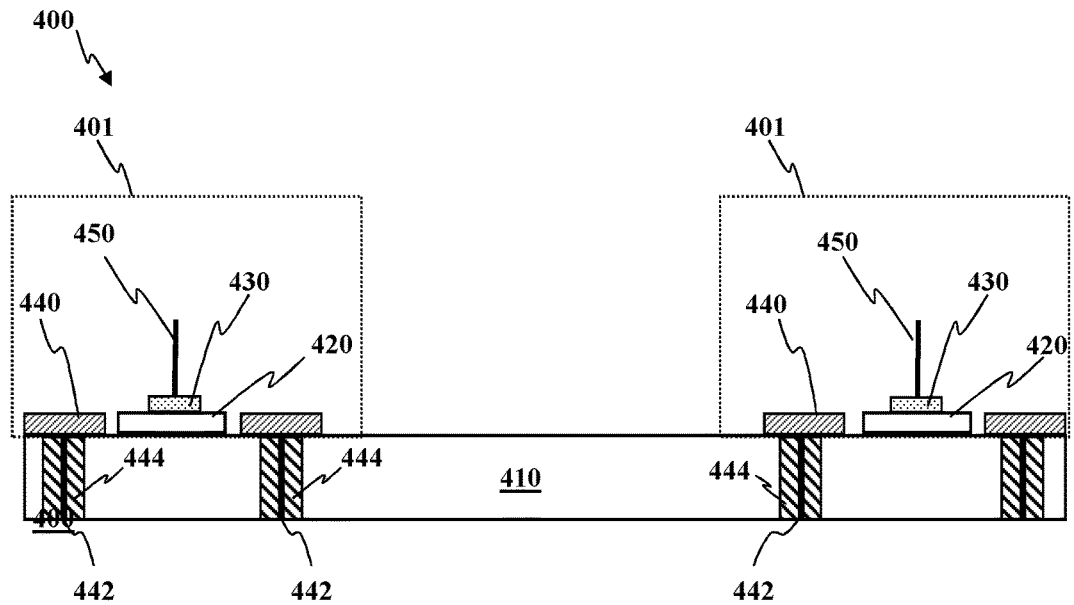
FIGS. 4A-4B are cross sectional views showing field emitters with a segmented electrode surrounding the emitter according to aspects of the present disclosure.
Figure 4B:
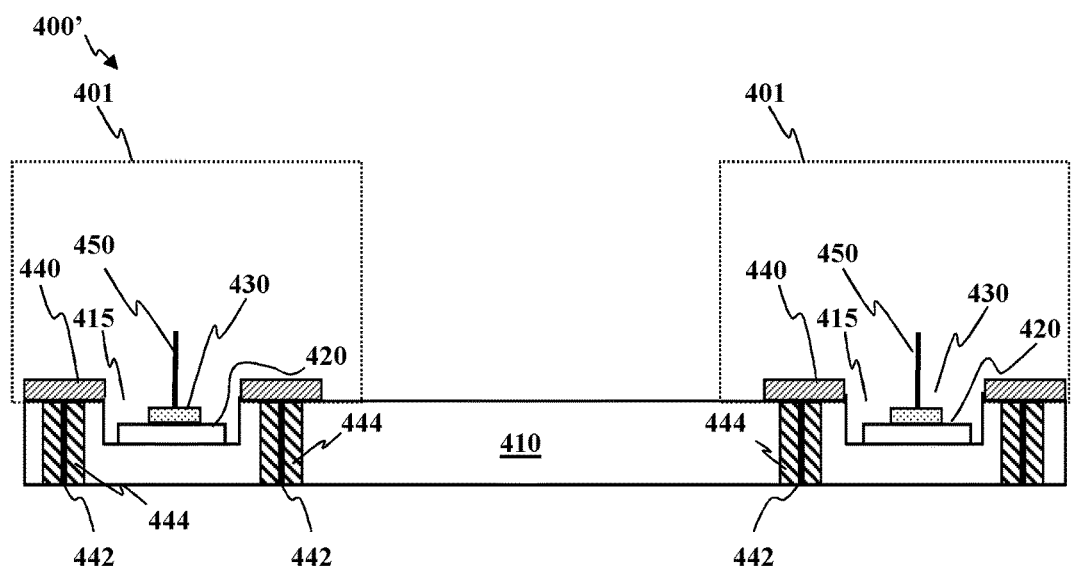

The electron source 115 includes a field emission device 201. A field emission device comprises a field emitter cathode and an anode spaced from the cathode. The cathode may be tip or needle field emitter element 210. Since the tip/needle emitter may not be straight or in same length, the field emission device 115 according to the present disclosure includes a segmented electrode 220 proximate to and/or behind the tip of the emitter element 210 for correction of electron optical aberrations in accordance with aspects of the present disclosure. Although a single field emission device 201 is shown in FIG. 1A, those skilled in the art will recognize that the electron source 115 may include a field emitter array containing multiple field emission devices, which may be independently controllable. Furthermore, although the segmented electrode 220 is depicted as being located behind the tip of the emitter element 210 this is not a limiting feature. Alternatively, the segment elected 220 may be even with or in front of the tip of the emitter element 210. For example, the emitter element 210 may be formed in a cavity in substrate and the segmented electrode may be formed around the cavity at the surface of the substrate, e.g., as shown in FIG. 4B. Depending on the depth of the cavity and the length of the emitter element, the segmented electrode may be located behind the emitter tip, in front of the emitter tip or at the same height as the emitter tip.

A beam of electrons $e^-$ from the electron beam column 102 are focused onto a surface of the target 101, which may be an integrated circuit wafer or a test wafer. The target 101 is supported by a stage 118. The electrons may be scanned across the surface of the target 101, e.g., by magnet deflecting fields provided by one or more electrostatic deflector plates 106. Voltages are provided to the deflector plates 106 via a beam scanner driver 108. In some implementations, the beam scanner driver 108 may apply currents to magnetic coils to scan the electron beam across the target 101. Alternatively, the stage 118 may include a stage scanning mechanism 111 and stage scanner driver 119 configured to move the target along an X-Y plane parallel to the surface of the target 101 in one or more directions relative to the optical column 102. In some implementations the stage scanning mechanism 111 and stage scanner driver 119 may move the stage in one direction (e.g., the X direction) as the beam scanner driver 108 scans the beam in a different direction (e.g., the Y direction) in a line scan.

By way of example, and not by way of limitation, images may be generated by driving the beam scanner in a raster pattern in which the primary beam scans across the sample 101 in one direction with the beam scanner driver 108 and beam scanner coils 106 (or deflector plates) and the detector signal as a function of beam position is converted into a line of the image as is well known in the art. At an end of the scan of the beam in one direction (e.g., the X-direction), the beam location may be adjusted by a small amount (e.g., an amount comparable to a size of the beam spot on the sample) in a different direction (e.g., the Y-direction) and another scan may be performed to generate another line of the image. By repeating this process an image of part of the sample may be generated.

In alternative implementations, images may be generated by scanning the beam of electrons $e^-$ across the sample 101 in a line scan one direction (e.g., the X-direction) and converting the secondary detector signal as a function of beam position into a line of the image. The stage scanner driver 119 and stage scanning mechanism may translate the sample 101 by a small amount in a different direction (e.g., the Y-direction) at the end of each line scan.

Alternatively, the stage scanner driver 119 may drive the stage in both the X and Y directions relative to the optical column 102 to scan the beam across the target while the beam remains fixed relative to the optical column.

Electrons $e^-$ striking the target 101 are either backscattered or initiate secondary emission. The electron beam column collects a portion of such backscattered or secondary electrons 117 (or other secondary particles, such as ions, X-rays, or ultraviolet photons) that emerge from the surface of the target 101. In the illustrated example, the secondary particle detector is configured to detector backscattered primary electrons or secondary electrons that travel back up through the electron beam column 102 and impinge on a secondary particle detector 110, which generates a secondary signal that is proportional to the amount of backscattering or secondary emission. The signal may be amplified by an amplifier 112. The amplified signal and a signal from the beam scanner driver 108 and/or stage scanner driver 119 are combined by an image generator 114 to produce a magnified image of the surface of the target 101. Images generated by the image generator 114 may be analyzed by the image analyzer 116, e.g., to determine a measure of quality of the modified surface or shape and size of resulting formed structures. In alternative implementations, the secondary particle detector 110 may be located outside the electron optical column 102 and may be located close to the target to collect the secondary particles 117.

The secondary particle detector 110 is generally configured to generate a signal in response to secondary particles arriving at the detector. The design of the secondary particle detector 110 may depend on the type of particles being detected. In certain implementations, the secondary particle detector 110 may be a diode device with a junction and depletion region. By way of example and not by way of limitation, detector 110 can be a PN junction, a PIN junction. In alternative implementations, the detector 110 may be a CMOS detector (e.g., CCD), silicon-based or III-V detector, multi-channel plate, photodiode array, avalanche photodiode and/or Schottky diode. In one example, the detector 110 is PN junction diode that includes a positively doped P region and a negatively doped N region. A depletion region, an area of neutral charge, exists between the P and N regions. When a photon enters the device, electrons in the crystalline structure become excited. If the energy of the photon is greater than the bandgap energy of the material, electrons will move into the conduction band crating holes in the valence band where the electrons were. These electron-hole pairs are created throughout the device. Those generated in the depletion region drift to their respective electrons. This results in a positive charge buildup in the P layer and a negative one in the N layer. The amount of charge is directly proportional to the amount of light falling on the detector.

As shown in the block diagram of FIG. 1B, the image generator 114 and image analyzer may be part of a controller 120. The controller 120 may be a self-contained microcontroller. Alternatively, the controller 120 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of the program code 125. The code 125 may control, e.g., the electron beam voltage and current produced by the source 115, the focusing of the beam with the beam optics 135 and the immersion lens 104, the scanning of the electron beam by the coils 106, the scanning of the stage 118 by the stage scanner 111 and the formation of images with the signal from the secondary particle detector 110 in a conventional fashion. The code 125 may also implement analysis of the images.

The code 125 may conform to any one of a number of different programming languages such as Assembly, C++, JAVA or a number of other languages. The controller 120 may also include an optional mass storage device, 132, e.g., CD-ROM hard disk and/or removable storage, flash memory, and the like, which may be coupled to the control system bus 130. The controller 120 may optionally include a user interface 127, such as a keyboard, mouse, or light pen, coupled to the CPU 122 to provide for the receipt of inputs from an operator (not shown). The controller 120 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 120 may exchange signals with the imaging device scanner driver 108, the e-beam driver 135 and the detector 110 or amplifier 112 through the I/O functions 123 in response to data and program code instructions stored and retrieved by the memory 124. Depending on the configuration or selection of controller 120, the scanner driver 108, detector 110, and/or amplifier 112 may interface with the I/O functions 123 via conditioning circuits. The conditioning circuits may be implemented in hardware or software form, e.g., within code 125. Also, in some implementations, the functions of the signal processor 144 may be implemented in software within the code 125.

Figure 2:
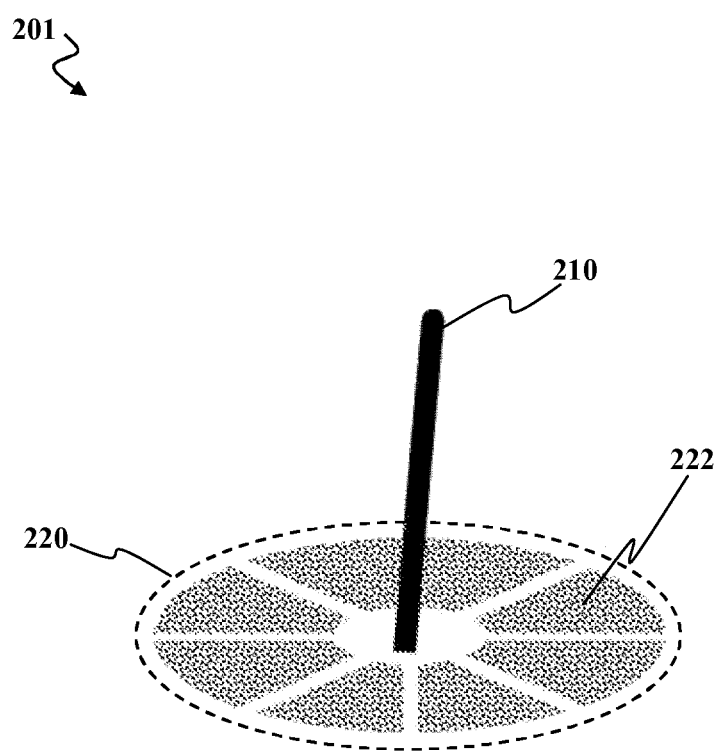
FIG. 2 is a side view showing a field emitter element with a segmented electrode around the emitter element according to an aspect of the present disclosure.

FIG. 2 is a side view showing the details of a field emission device 201 for the electron source 115 in accordance with aspects of the present disclosure. The field emission device includes one or more field emitter elements 210 with a segmented electrode 220 around the emitter element. The field emitter element 210 has an emitter tip having a high aspect ratio structure with a nanometer scaled cross section. The aspect ratio (length divided by characteristic cross-sectional dimension may be between about 10 and about 1000. For practical use as an emitter tip, the characteristic cross-sectional dimension (e.g., diameter) may range from about 10 nanometers (nm) to about 1 micron ($\mu$m).

By way of example and not by way of limitation, the emitter element 210 may be a carbon nanotube or a nanostructured tip emitter. Alternatives to carbon nanotubes include other nanoemitters, such as tungsten-carbide tips, silicon tips, that are of similar dimensions or fabricated in a similar fashion. By way of example and not by way of limitation, the length of the emitter element 210 may range from about 100 nm to about 1 millimeter. In contrast to conventional closed-gated concepts, the emitter 210 according to an aspect of the present disclosure remains in a semi-open region to preserve high effective vacuum conductance. If the emitter were mostly enclosed (e.g., if the emitter element were formed in a cavity) it would be difficult to pump out the emitter enclosure to obtain high vacuum or ultra-high vacuum. In such cases, it is advantageous to form the emitter element in an open region. However, this is not a problem for applications not involving high vacuum or ultra-high vacuum.

Figure 3A:
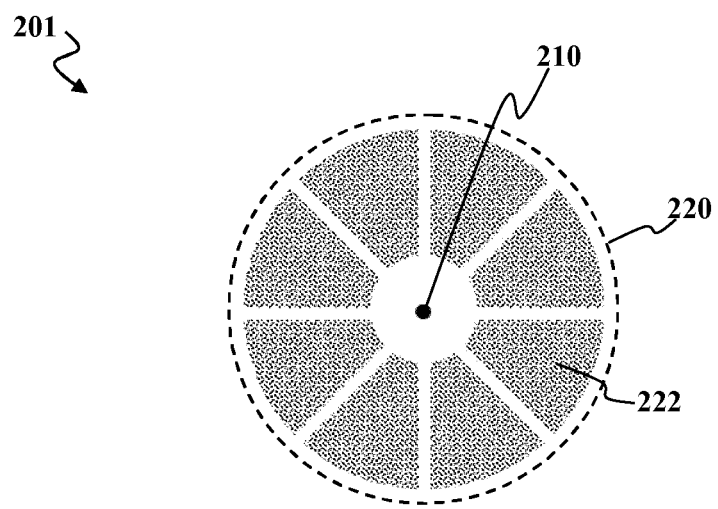
FIGS. 3A-3B are top views showing the field emitter with a segmented electrode surrounding the emitter according to an aspect of the present disclosure.
Figure 3B:
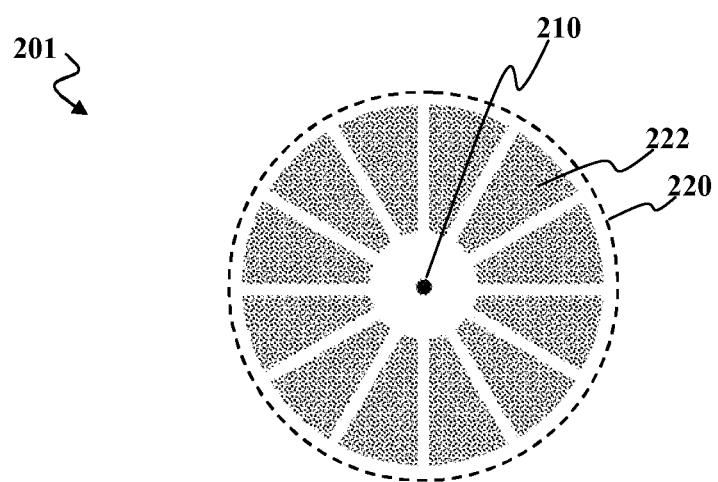

A segmented electrode 220 is provided proximate to the tip of the emitter 210. In some implementation, the segmented electrode is provided behind the tip of the emitter. In some implementations, the segmented electrode is provided proximate to the tip of the corresponding emitter within a distance of about one to two emitter lengths. The inner diameter of the segmented electrode 220 is about 1 micron. The outer diameter is on the order of tens of microns. The segmented electrode 220 has multiple electrode plates 222. In some embodiments, the number of the electrode plates is twice of the multipole moments to be corrected. For example, four electrode plates are used to correct for X-Y deflection (i.e., a dipole moment). As shown in FIG. 3A, eight electrode plates are required to fully control astigmatism (i.e., a quadrupole moment). That is, one quadrupole aligned with X and Y and another quadrupole aligned at 45° to X and Y. Twelve plates are used for a hexaopole moment (as shown in FIG. 3B) and sixteen plates are used for an octopole moment. Thus, in some embodiments the segmented electrode 220 may have 4, 8, 12 or 16 electrode plates 222. It is noted that in some embodiments, the number of poles that can be made is limited by lithography. The electrode plates 222 are electrically isolated from each other so that voltages may be applied independently to each of the plates. Voltages applied to the plates 222 may be separately controlled by beam driver 136 through code 125 for electron beam corrections. The gap between adjacent electrode plates is large enough to prevent field breakdown for safety. By way of example, the gap is of order of 1 micron.

It should be noted that in addition to SEM systems, many other charged particle systems may employ the field emission device according to the present disclosure. Examples of systems may include field emitter displays, arrayed electron sources for accelerations or free electron lasers, charged particle thruster arrays for miniature spacecraft applications, or other applications that utilize field emitter arrays.

The segmented electrode according to the present disclosure may be manufactured independently of the emission device or manufactured as an integrated part of the emission device through techniques such as nanofabrication/MEMS. FIG. 4A is a cross sectional view showing an emitter array device 400 containing multiple field emitter devices 401, each with an integrated multi-pole electrode plates 440 surrounding emitter elements 450 according to an aspect of the present disclosure. In the illustrated example, the emitter array device 400 includes a substrate 410. In one implementation, the substrate 410 may be made from lightly doped silicon. A number of barrier islands 420 are formed on top of the substrate 410. Catalyst structures 430 are formed on the barrier islands 420. In field emission devices, a barrier layer is usually provided to prevent diffusion of material from the substrate 410 into the catalyst structures 430. In one implementation, the barrier islands may be made from titanium nitride (TiN), titanium (Ti), indium tin oxide (ITO) or silicon dioxide ($SiO_2$). The barrier islands 420 may be formed by blanket deposition of a barrier layer followed by an etching process. The barrier islands 420 are formed at the locations of the device features (i.e., the field emitters). FIG. 4B is a cross-sectional view showing a similar emitter array device 400' in which the emitter elements 450 are formed in cavities 415 in the substrate 410.

In an example where carbon nanotubes or other nanostructures are used as field emitter, a metal layer is used as a catalyst for growing nanotubes on top of it. The catalyst structures 430 may be formed from a patterned layer of metal formed on top of the barrier islands 420. By way of example and not by way of limitation, the metal layer that is used to form the catalyst structures 430 may be made from Nickel (Ni), Chromium (Cr), Iron (Fe) for nanotubes or Gold (Au) for other nanostructures. In one example, the catalyst structures 430 may be formed a layer of metal by a lithographic process involving patterning and selective etching of an oxide layer formed over the barrier islands 420 followed by metal deposition and chemical mechanical polishing (CMP). Emitter elements 450 in the form of nanotubes may be subsequently grown on the catalyst structures 430. The adjacent emitters are usually spaced apart by a distance of over 100 microns, e.g., between about 100 microns and about 1 millimeter (1000 microns).

A number of electrode plates 440 are formed surrounding each barrier island 420 and over the substrate. By way of example and not by way of limitation, the electrode plates 440 may be made from a metal, such as aluminum or copper or other electrically conductive material, such as doped polysilicon. The electrode plates 440 may be fabricated using conventional lithographic techniques used in semiconductor integrated circuit device fabrication. Such techniques may involve blanket deposition of metal followed by patterned etch or patterned deposition of metal. Independent voltages may be applied to the electrode plates 440, e.g., through conductive vias 442 that are formed through the substrate 410 and isolated from the substrate and from each other by insulating material 444.

In certain implementations, the above-described field emission device includes a segmented electrode surrounding the tip/needle emitter. The segmented electrode allows fast or static steering corrections of any beam pointing or position variations of the emitter by programming the electrode voltages to produce a dipole field in the desired direction that corrects the beam path. In addition, it may provide fast or static stigmation correction for any fluctuation in the ellipticity of the emitted beam by application of voltages to the segmented electrodes that generate the require quadrupole field to make the stigmation correction. Furthermore, it may allow fast or static higher-order correction. For example, if the electrode structure is a dodecapole it could allow for a programmable sextupole field for future higher-order optical aberration corrections in the electron column.

The segmented electrode surrounding the emitter element allows for larger degree of compensation for perturbations on the emitter and larger amount of decoupling in the tuning of the electron beam. Conventional devices require significant tuning in the beam optics downstream of the gun to correct perturbations within the gun. With the emitter element surrounded by the segmented electrode, perturbations at the emitter may be tuned out by applying suitable combinations of voltages to the plates that make up this electrode with little or no need for further correction downstream. In addition, since the segmented electrode is placed near to the tip of the emitter, smaller voltages are required for correction. The device according to the present disclosure also allows for implementing beam blanking right at the emitter plane.

While the above includes a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112(f). In particular, the use of "step of" in the claims herein is not intended to invoke the provisions of 35 USC §112(f).

What is claimed is:

1. A field emission device, comprising:
   one or more emitter elements formed on a substrate, each element having a high aspect ratio structure with a nanometer scale cross section; and
   one or more segmented electrodes formed on the substrate, each electrode surrounding a corresponding one of the one or more emitter elements, wherein each of the one or more segmented electrodes includes multiple electrode plates in a number twice that is a number of multipole moments to be corrected, wherein independent voltages are applied to each of the multiple electrode plates through conductive vias formed through the substrate and isolated from the substrate and from other conductive vias by an insulating material and, wherein the one or more segmented electrodes are configured as a steering element to provide beam steering control.

2. The device of claim 1, wherein the one or more segmented electrodes are provided behind tips of corresponding emitters.

3. The device of claim 1, wherein the one or more segmented electrodes are provided proximate to tips of corresponding emitters within a distance of two emitter lengths.

4. The device of claim 1, wherein each of the one or more emitters are in a length between about 100 nanometers and about 1 millimeter and a cross-sectional dimension between about 10 nanometers (nm) and about 1 micron (μm).

5. The device of claim 1, wherein the one or more emitter elements are nanotubes.

6. The device of claim 1, wherein the electrode plates are electrically isolated from each other.

7. The device of claim 1, wherein the one or more segmented electrodes have 4, 8, 12 or 16 electrode plates.

8. The device of claim 1, wherein each of the one or more emitter elements is formed in a cavity of the substrate and the corresponding one of the one or more segmented electrodes is formed on a top surface of the substrate.

9. A method, comprising:
 forming one or more emitter elements on a substrate, wherein each of the one or more emitter elements has a high aspect ratio structure with a nanometer scale cross section; and
 forming one or more segmented electrodes on the substrate, each surrounding one of the one or more emitter elements, wherein each of the one or more segmented electrodes has multiple electrode plate in a number twice a number of multipole moments to be corrected, wherein independent voltages are applied to the multiple electrode plates through conductive vias formed through the substrate and isolated from the substrate and from other conductive vias by an insulating material and, wherein the one or more segmented electrodes are configured as a steering element to provide beam steering control.

10. The method of claim 9, wherein the one or more segmented electrodes are formed behind tips of the one or more emitter elements.

11. The method of claim 9, wherein forming the one or more segmented electrodes proximate to tips of corresponding emitters within a distance of two emitter lengths.

12. The method of claim 9, wherein each of the one or more emitter elements is formed in a cavity of the substrate and the corresponding one of the one or more segmented electrodes is formed on a top surface of the substrate.

13. The method of claim 9, further comprising forming a barrier layer at locations of the one or more emitter elements between the one or more emitter elements and the substrate.

14. A system comprising:
 a field emission device comprising:
  one or more emitter elements formed on a substrate, each element having a high aspect ratio structure with a nanometer scale cross section; and
  one or more segmented electrodes formed on the substrate, each electrode surrounding a corresponding one of the one or more emitter elements, wherein each of the one or more segmented electrodes includes multiple electrode plates in a number twice a number of multipole moments to be corrected, wherein independent voltages are applied to the multiple electrode plates through conductive vias formed through the substrate and isolated from the substrate and from other conductive vias by an insulating material and, wherein the one or more segmented electrodes are configured as a steering element to provide beam steering control; and
 an electron optical column configured to form electrons emerging from the one or more emitter elements into one or more electron beams and image the one or more electron beams onto a target.

15. The system of claim 14, wherein the one or more segmented electrodes are provided behind tips of corresponding emitters, whereby the tips of the corresponding emitters are located between the one or more segmented electrodes and one or more electron optics elements of the electron optical column downstream of the tips.

16. The system of claim 14, further comprising a secondary particle detector configured to detect secondary particles generated as a result of an interaction between the target and the one or more electron beams and generate a signal corresponding to a flux of the secondary particles at the secondary particle detector.

17. The system of claim 16, further comprising an image generator configured to generate one or more images of the target from the signal corresponding to the flux of the secondary particles at the secondary particle detector.

18. The system of claim 16, wherein the system is configured to operate as a scanning electron microscope.

19. The system of claim 16, wherein system is configured to perform a line scan of a primary beam of electrons across the sample in a first direction in conjunction with translation of the sample in a second direction that is different from the first direction.

20. The system of claim 19, further comprising an image generator configured to produce an image of the sample from the signal produced by the secondary particle detector in conjunction with translation of the sample in a second direction that is different from the first direction.

21. The system of claim 14, wherein the one or more emitter elements are nanotubes.

22. The system of claim 14, wherein the one or more segmented electrodes have 4, 8, 12 or 16 electrode plates.

23. The system of claim 14, wherein the one or more segmented electrodes have four or more electrode plates, wherein each electrode plate of the four or more electrode plates is configured such that separate voltages may be applied independently to each electrode plate.

24. The method of claim 14, wherein each of the one or more emitter elements is formed in a cavity of the substrate and the corresponding one of the one or more segmented electrodes is formed on a top surface of the substrate.

* * * * *